US010054992B1

(12) United States Patent
Ehlen et al.

(10) Patent No.: US 10,054,992 B1
(45) Date of Patent: Aug. 21, 2018

(54) STORAGE CARD ADAPTER WITH LATCH

(71) Applicant: Facebook, Inc., Menlo Park, CA (US)

(72) Inventors: Jon Brian Ehlen, Newark, CA (US); John Edward Fernandes, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/683,724

(22) Filed: Aug. 22, 2017

(51) Int. Cl.
*H05K 5/02* (2006.01)
*G06F 1/18* (2006.01)

(52) U.S. Cl.
CPC .............. *G06F 1/182* (2013.01); *G06F 1/187* (2013.01); *H05K 5/0221* (2013.01)

(58) Field of Classification Search
None
See application file for complete search history.

(56) References Cited

U.S. PATENT DOCUMENTS

| | | | | | |
|---|---|---|---|---|---|
| 5,484,063 A | * | 1/1996 | Cuccio | G11B 33/025 | 206/320 |
| 5,531,328 A | * | 7/1996 | Rochelo | H05K 5/0269 | 206/454 |
| 5,980,294 A | * | 11/1999 | Kanda | G06K 13/0843 | 361/679.32 |
| 5,986,891 A | * | 11/1999 | Sugimoto | H01R 12/714 | 361/736 |
| D436,314 S | * | 1/2001 | Hansen | D9/422 | |
| 6,174,188 B1 | * | 1/2001 | Martucci | G06K 7/0021 | 439/326 |
| 6,193,069 B1 | * | 2/2001 | Guenther | H05K 13/0084 | 206/706 |
| 7,118,419 B1 | * | 10/2006 | Lee | G06K 7/0021 | 439/630 |
| 7,161,811 B2 | * | 1/2007 | Richter | G06K 13/0862 | 361/737 |
| 7,494,195 B2 | * | 2/2009 | Han | H02G 3/081 | 312/223.2 |
| 8,023,259 B2 | * | 9/2011 | Lam | G06F 1/1616 | 292/253 |
| 8,464,873 B2 | * | 6/2013 | Uchida | B65D 81/36 | 206/722 |
| 9,122,458 B2 | * | 9/2015 | Yu | G06F 1/185 | |
| 9,122,970 B2 | * | 9/2015 | Huang | H01R 12/716 | |
| 9,176,546 B2 | * | 11/2015 | Chen | G06F 1/187 | |
| 9,282,658 B1 | * | 3/2016 | Tsai | G11B 33/124 | |
| 2002/0085345 A1 | * | 7/2002 | Chen | G06F 1/184 | 361/679.33 |

(Continued)

OTHER PUBLICATIONS

U.S. Appl. No. 15/666,438 by Ehlen J., filed Aug. 1, 2017.

*Primary Examiner* — Xanthia C Cunningham
(74) *Attorney, Agent, or Firm* — FisherBroyles, LLP

(57) ABSTRACT

Technology is provided for a storage card adapter. The storage card adapter is used for housing storage cards (e.g., M.2 storage cards), and the storage card adapter can then be inserted into a drive bay. The storage card adapter includes a latch system that, when engaged, brings together the cover and carrier frame of the storage card adapter such that at least 75 lbs. of compressive force is applied to thermal pads disposed on either side of storage cards housed within the storage card adapter. The storage card adapters can also include removable spring arms suitable for use in engaging the storage card adapter with a drive bay.

19 Claims, 10 Drawing Sheets

(56) References Cited

U.S. PATENT DOCUMENTS

2003/0151332 A1* 8/2003 Chen ........................ G06F 1/181
312/223.2
2009/0316350 A1* 12/2009 Hu ........................... H05K 5/03
361/679.33
2010/0091443 A1* 4/2010 Lam ...................... G06F 1/1616
361/679.33
2010/0096522 A1* 4/2010 Tsai ........................ G06F 1/187
248/217.4
2010/0097912 A1* 4/2010 Lin ...................... G11B 33/124
369/75.11
2011/0049319 A1* 3/2011 Peng ....................... G06F 1/187
248/309.1
2011/0310552 A1* 12/2011 Huang .................... G06F 1/187
361/679.37
2012/0218705 A1* 8/2012 Huang .................... G06F 1/187
361/679.37
2014/0077676 A1* 3/2014 Lu ........................ G11B 33/027
312/326
2016/0054767 A1* 2/2016 Chen ....................... G06F 1/187
361/679.39

* cited by examiner

STORAGE CARD ADAPTER WITH LATCH

TECHNICAL FIELD

This patent application is directed to storage card adapters, and more specifically to storage card adapters having a latch system for securing together a cover and carrier frame and optionally providing compression to components housed within the storage card adapter.

BACKGROUND

Storage card adapters are useful for securely housing a printed circuit board (PCB) having a plurality of storage cards connected thereto and providing a mechanism for easily connecting the PCB and associated storage cards into a drive bay. Some storage card adapters are used for housing a PCB and a plurality of M.2 storage cards.

When M.2 storage cards are housed within a storage card adapter, a problem commonly faced is the heat given off by the plurality of M.2 storage cards. In order to cool the interior space of the storage card adapter, many different features can be provided. For example, storage card adapters are typically provided with heat sinks, heat fins, and various other geometries specifically designed to draw heat away from the M.2 storage cards and out of the storage card adapter.

Another feature that is sometimes used to cool storage cards within a storage card adapter are thermal pads. Thermal pads generally reside directly against the top and bottom surfaces of M.2 storage cards housed inside of a storage card adapter. This direct contact helps to draw heat away from the storage cards. It is known that thermal pads are generally more efficient at drawing heat away from storage cards when they are pressed firmly against the M.2 storage cards. However, it is sometimes difficult to achieve a desired amount of compressive force on the thermal pads using conventional storage card adapters. It can also sometimes be difficult and uncomfortable for a user to accomplish the desired amount of compressive force using previously known mechanisms for securing a cover to a carrier frame of a storage card adapter to thereby achieve the desired compressive forces. Accordingly, a need currently exists for a storage card adapter that is capable of applying a high amount of compressive force on thermal pads housed within the storage card adapter and that is also easy for a user to apply the compressive force.

BRIEF DESCRIPTION OF THE DRAWINGS

Embodiments of the storage card adapters disclosed herein may be better understood by referring to the following Detailed Description in conjunction with the accompanying drawings, in which like reference numerals indicate identical or functionally similar elements.

Figure 1:
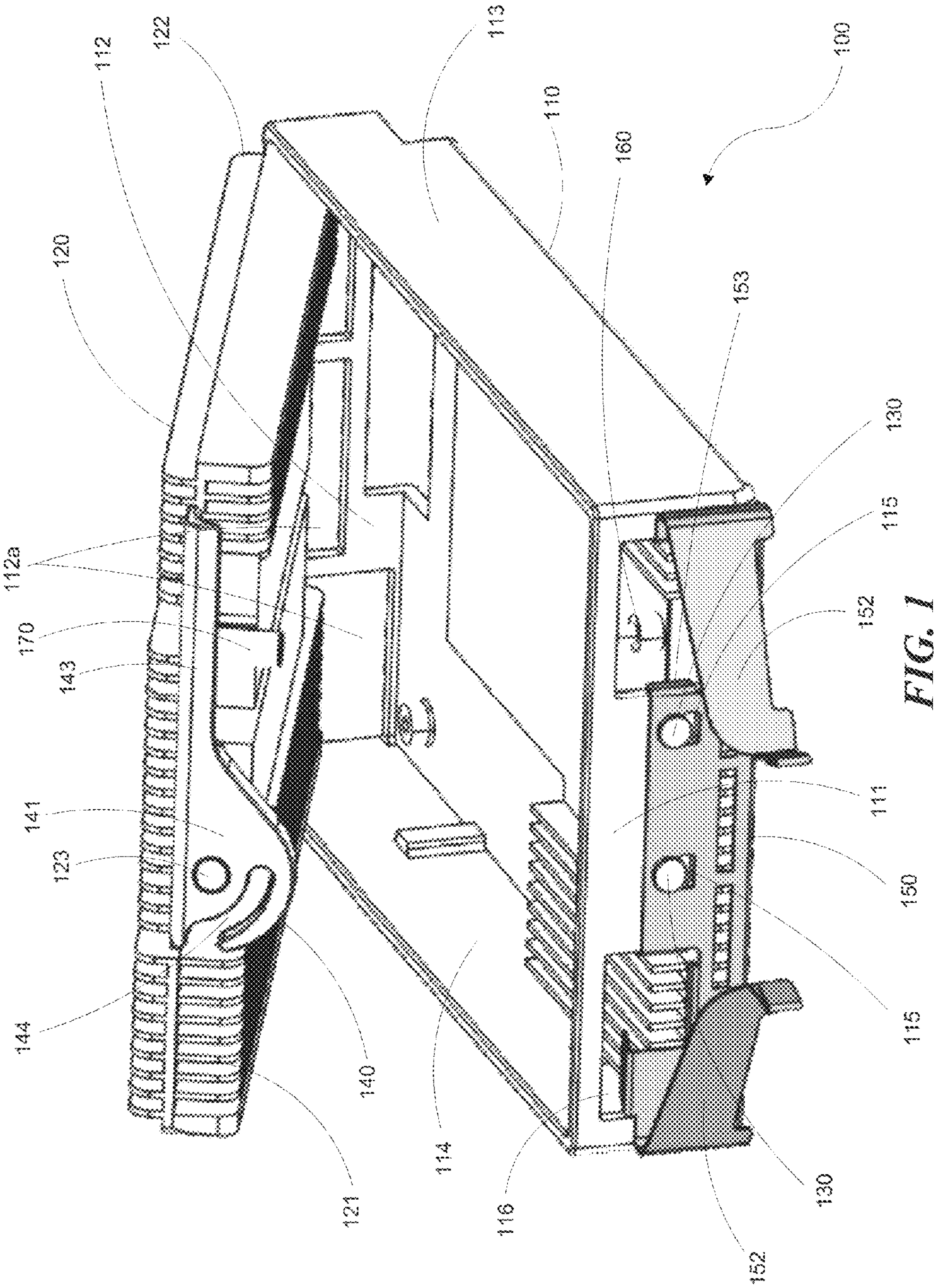
FIG. 1 is an isometric view of a storage card adapter according to a representative embodiment.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

A storage card adapter with a latch is disclosed. The storage card adapter houses a plurality of storage cards (e.g., M.2 storage cards), each of which is sandwiched between two thermal pads. The latch of the disclosed storage card adapter ensures that the cover of the storage card adapter is secured to the carrier frame of the storage card adapter. The latch can also be configured to ensure sufficient compressive force is applied to the sandwich of thermal pads and the storage card housed within the storage card adapter to thereby enhance the efficiency of the thermal pads in drawing heat away from the storage card.

In an embodiment, the storage card adapter includes a carrier frame and a cover configured to mate with an open top of the carrier frame and form an enclosed area within which can be disposed one or more storage cards. The carrier frame has an envelope compatible with a drive bay, for example, and is configured to receive a printed circuit board. The carrier frame includes at least a front end side wall and a back end side wall opposite the front end side wall. At least one opening is provided in the front end side wall. The storage card adapter further includes at least one pin that extends through the opening in the front end side wall of the carrier frame. The cover includes a pivot post extending from a front edge of the cover and a latch clamp pivotably attached to the pivot post. The latch clamp includes a curved slot. The positioning of the opening in the front end side wall of the carrier frame through which the pin extends relative to the latch clamp is such that the pin can be received in the curved slot and pivoting of the latch clamp results in movement of the pin through the length of the curved slot. This action brings together the cover and the carrier frame and can thereby apply compressive force to components housed within the storage card adapter.

In another embodiment, the storage card adapter includes a carrier frame, a cover configured to mate with an open top of the carrier frame, and a latch. A front end side wall of the carrier frame includes an aperture. The cover includes a tab extending in a perpendicular direction from an interior surface of the cover proximate a front edge of the cover, the tab including an aperture. The latch is removably coupled to the front end side wall of the carrier frame and includes an interior segment having a protrusion proximate the distal end of the interior segment, an exterior segment angled away from the front end side wall, and a coupling segment connecting the interior segment and the exterior segment. The cover, carrier frame and latch are configured such that when the cover is mated with the carrier frame, the protrusion on the interior segment of the latch is received within the aperture in the tab extending from the cover, which thereby secures the cover to the carrier frame and may apply compressive force to components housed within the storage card adapter.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description. The terminology used below is to be interpreted in its broadest reasonable manner, even though it is being used in conjunction with a detailed description of some specific examples of the embodiments.

FIG. 1 illustrates a storage card adapter 100 according to a representative embodiment. The overall dimensions of the storage card adapter 100 are selected such that the storage card adapter 100 has an envelope compatible with a drive bay into which the storage card adapter 100 can be inserted. For example, in the depicted embodiment, the storage card adapter 100 has an envelope compatible with a drive bay configured to receive a 3.5 inch hard drive.

The storage card adapter 100 includes a carrier frame 110 and a cover 120. The carrier frame 110 includes a front end side wall 111, a back end side wall 112 opposite the front end side wall 111, a first side wall 113 and a second side wall 114 opposite the first side wall 113. The area defined by the front end side wall 111, the back end side wall 112, the first side wall 113 and the second side wall 114 is dimensioned such that the carrier frame can receive and house a printed circuit board (PCB) having storage cards connected thereto. The back end side wall 112 includes a plurality of openings **112*a* that are used primarily for ventilation. The openings 112*a* can also serve as an opening through which tabs extending from the back edge of the cover 120 can extend so that the cover 120 is secured with the carrier frame 110 along the back end side wall 112 when the cover 120 is mated with the carrier frame 110. The front end side wall 111 can also include openings 116** that are provided primarily for ventilation.

With reference to FIG. 1, guide posts 160 and clamping posts 170 can be provided to support and secure the storage cards housed within the storage card adapter 100. The guide posts 160 are provided proximate the front end side wall 111 of the carrier frame 110. Specifically, the guide posts 160 are positioned at a location within the carrier frame 110 such that when a storage card is inserted in a storage card connector of a PCB housed in the carrier frame 110, the opposite end of the storage card rests on a ledge provided on the guide post 160. The clamping posts 170 are provided proximate the front edge 121 of the cover 120 and each clamping post 170 is aligned with a respective guide post 160. The clamping posts 170 may include a recess in which a distal end of the corresponding guide post 160 can be received. The guide posts 160 and the clamping posts 170 are dimensioned such that when the cover 120 is closed on top of the carrier frame 110, the distal end of a storage card is clamped between the guide posts 160 and the clamping posts 170.

The front end side wall 111 of the carrier frame 110 includes at least one opening 115 configured for receiving a pin 130. As shown in FIG. 1, the front end side wall 111 includes two openings 115. However, the front end side wall 111 can also include a single opening 115 or more than two openings 115. The pins 130 extending through each opening 115 provided in the front end side wall 111 generally include a shaft and a pin head having a diameter that is larger than the shaft. The pins 130 are installed in the openings 115 such that the pin head is on the exterior side of the front end side wall 111. The pins 130 can be retained in the openings 115 by a friction fit, such as where the size of the opening 115 is approximately equal to the size of the shaft of the pin 130.

Figure 2:
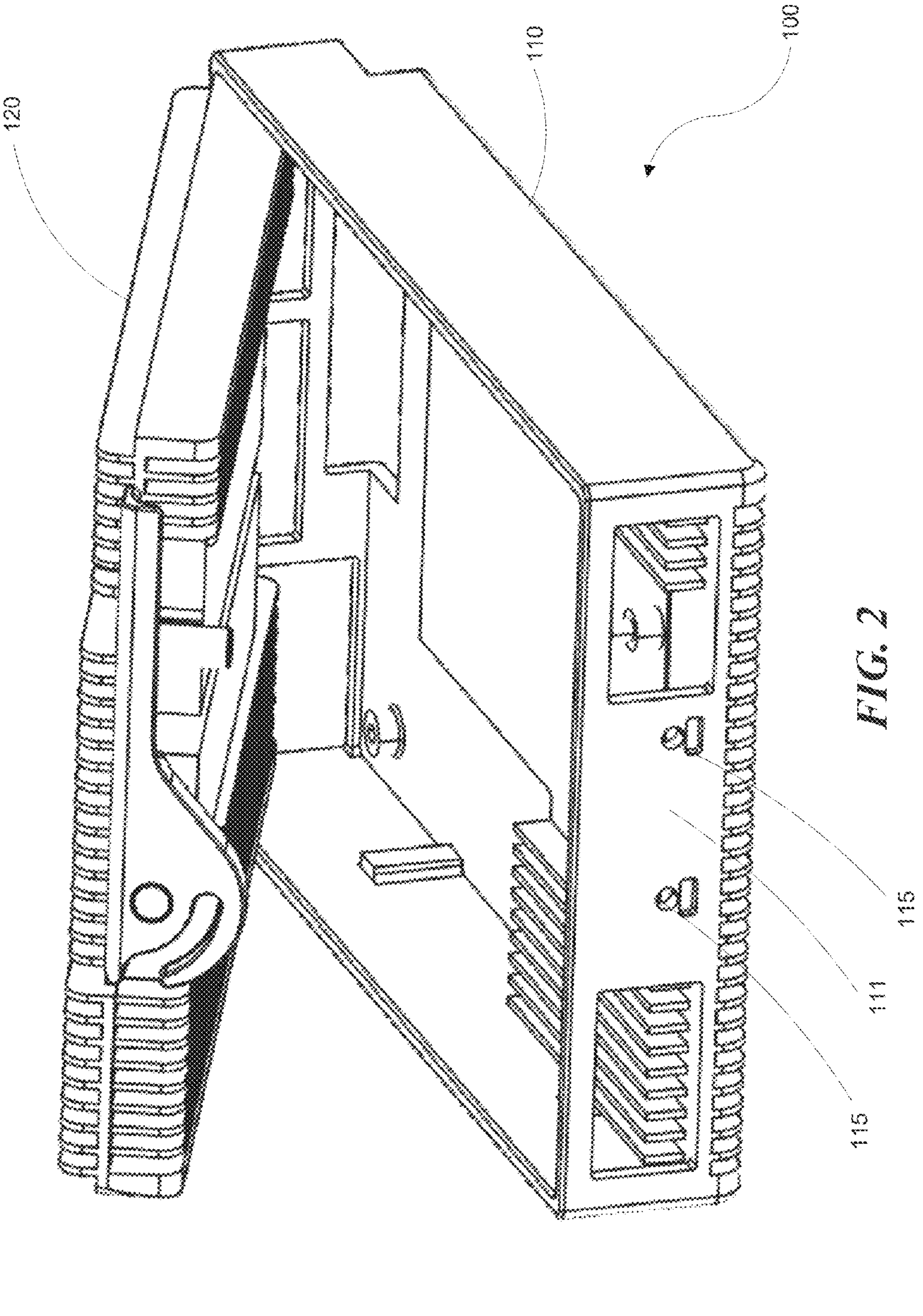
FIG. 2 is an isometric view of the storage card adapter shown in FIG. 1 with the spring arm attachment removed.

The openings 115 can include a first portion occupied by the pin 130 when the pin 130 is inserted in the opening 115, and a portion that remains unoccupied when the pin 130 is inserted in the opening 115. With brief reference to FIG. 2, this unoccupied portion has a square shape and is the lower portion of the opening 115. However, the unoccupied portion can have other shapes and/or be located elsewhere on the opening 115.

Returning to FIG. 1, the dimensions of the cover 120 are such that the cover 120 fits within the space defined by the front end side wall 111, the back end side wall 112, the first side wall 113, and the second side wall 114 when the cover 120 is mated with the carrier frame 110. The cover 120 generally includes a front edge 121 and a back edge 122, with the back edge 122 aligning with the back end side wall 112 to provide a pivot point for the cover 120. The front edge 121 of the cover 120 includes a pivot post 123 extending outwardly from the front edge 121 in a generally horizontal direction.

Figure 3:
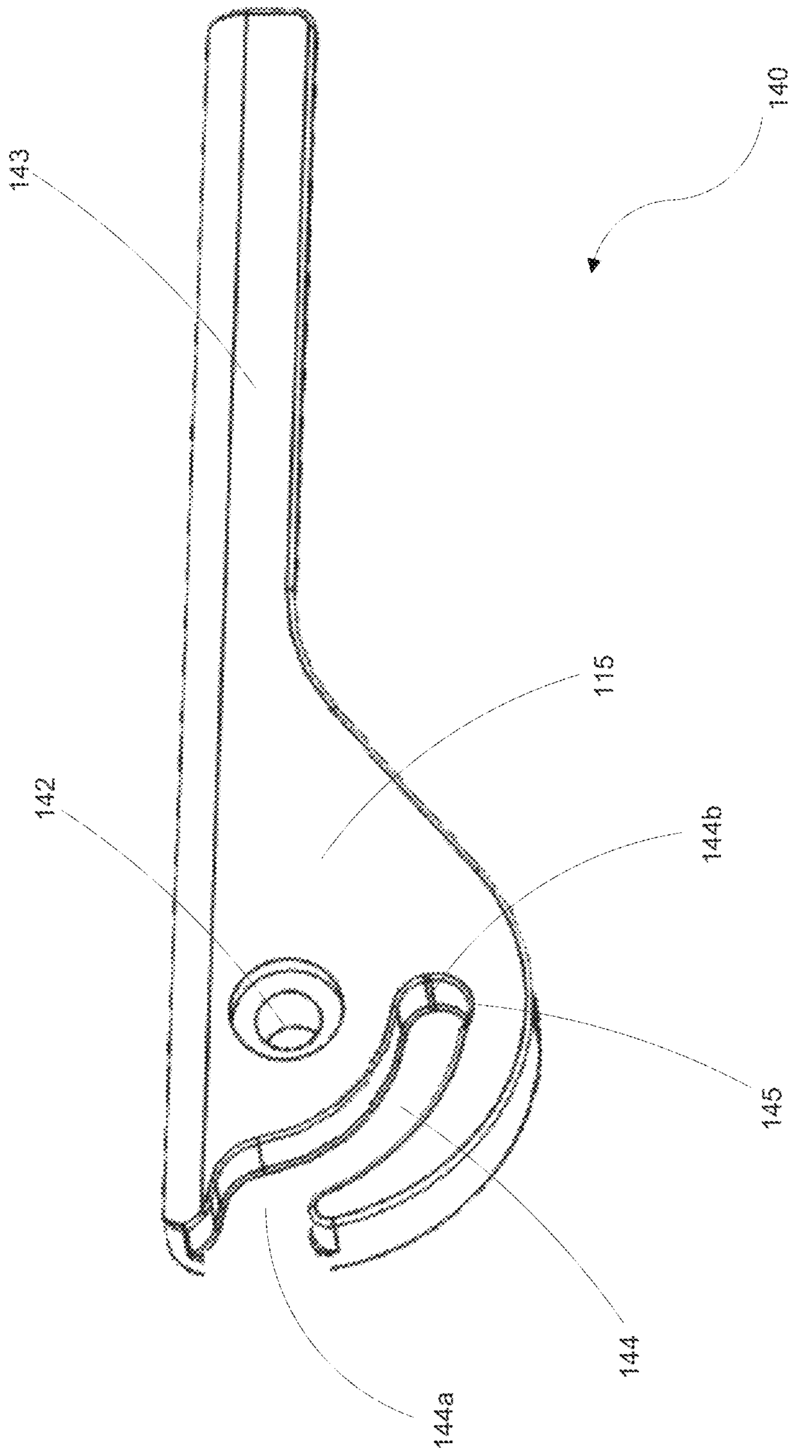
FIG. 3 is an isometric view of the latch clamp of the storage card adapter shown in FIG. 1.

With reference to FIGS. 1 and 3, connected to the pivot post 123 and pivotable about the pivot post 123 is a latch clamp 140. The latch clamp 140 generally includes a central portion 141 including a hole 142 through which the pivot post 123 extends to connect the latch clamp 140 to the cover 120 and a lever 143 extending out from the central portion 141. The latch clamp 140 further includes a curved slot 144 in the central portion 141, the curved slot having an open end **144*a* and a closed end 144*b***.

In operation, the latch clamp 140 engages with one of the pins 130 to secure the cover 120 to the carrier frame 110 and, in some embodiments, bring the cover 120 and the carrier frame 110 closer together so as to apply compressive force to components housed within the storage card adapter 100. Specifically, the location of the pin 130, the pivot post 123, the open end **144*a* of the curved slot 144 of the latch clamp 140, and other relevant components are designed such that when the cover 120 is mated with the carrier frame 110, the pin 130 (and specifically the pin head) is received in the open end 144*a* of the curved slot 144. The latch clamp 140 can then be pivoted about the pivot post 123 in a direction (e.g., clockwise) such that the pin 130 travels into the curved slot 144 towards the closed end 144*b*. The curved shape of the curved slot 144 ensures that as the pin 130 travels through the slot 144 via pivoting of the latch clamp 140, the cover 120 is drawn closer to the carrier frame 110, which can thereby provide a desired compressive force. In some embodiments, the dimensions and location of the various components involved in the latching of the cover 120 to the carrier frame 110 are selected such that at least 75 lbs. of compressive force are applied to components housed within the storage card adapter 100 when the pin 130 reaches the closed end 144***b* of the curved slot 144.

In one embodiment, the latch clamp 140 is designed such that the open end 144*a* of the curved slot 144 aligns with and is capable of receiving the pin 130 when the lever 143 is in a vertical position (i.e., perpendicular to the cover 120). The latch clamp 140 is further designed such that pivoting the latch clamp 140 (such as by moving or pressing the lever 143) approximately 90 degrees to a position where the lever 143 is in a horizontal position (i.e., parallel with the cover 120) draws the pin 130 through the entire length of the curved slot 144 to the closed end 144*b* of the curved slot 144. The closed end 144*b* of the curved slot 144 can include a recess 145 designed to receive the pin 130 and hold the latch clamp 140 in place so that relative movement of the pin 130 back towards the open end 144*a* of the curved slot 144 is inhibited.

Figure 4:
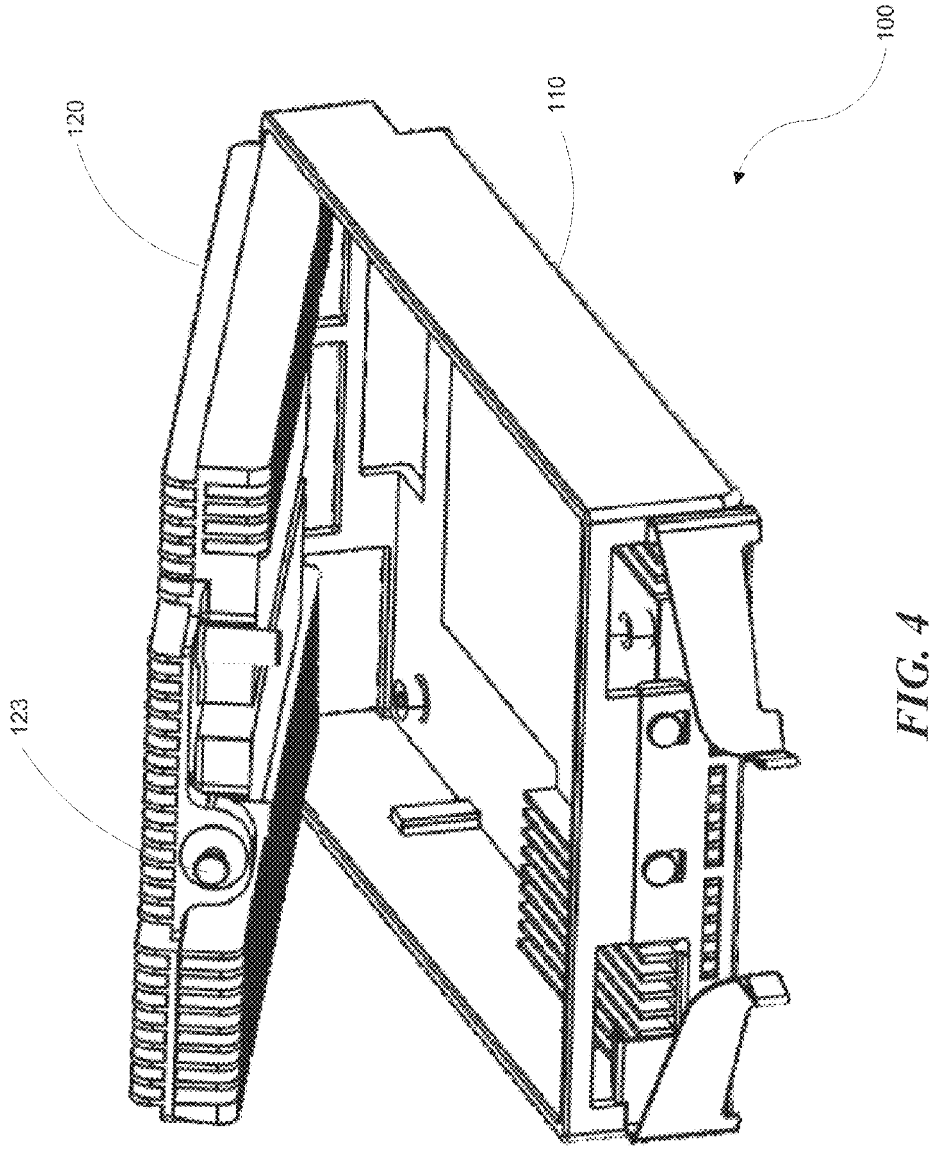
FIG. 4 is an isometric view of the storage card adapter shown in FIG. 1 with the latch clamp removed.

FIG. 4 illustrates the storage card adapter 100 without the latch clamp 140 to more clearly show the pivot post 123. The pivot post 123 can include an enlarged distal end. Referring again to FIG. 3, the pivot post 123 can be received in the hole 142 in the latch clamp 140, which includes a wider diameter portion adapted to receive the enlarged distal end of the pivot post 123 and thereby secure the latch clamp 140 to the pivot post 123.

Figure 5:
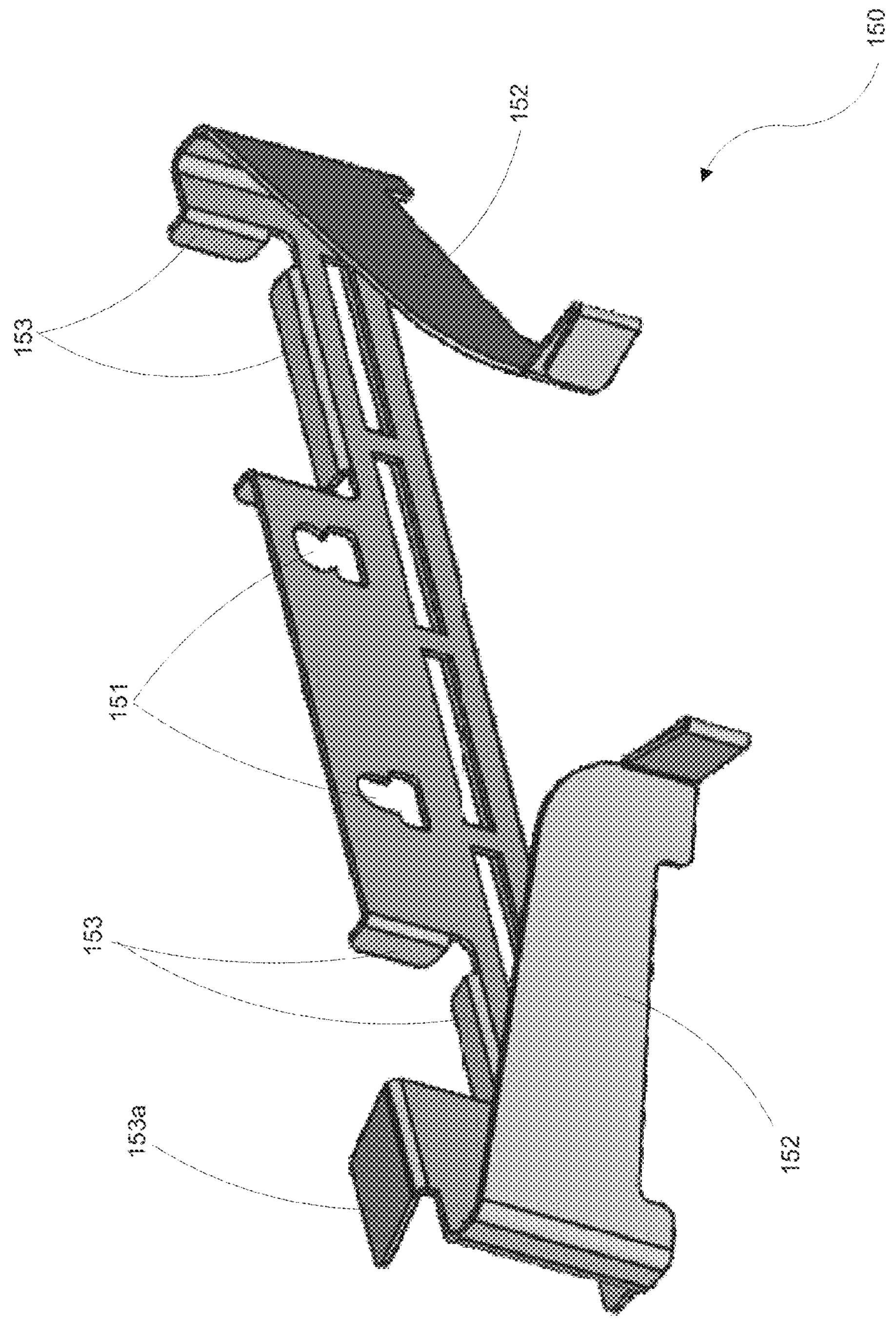
FIGS. 5 and 6 are isometric views of the spring arm attachment of the storage card adapter shown in FIG. 1.
Figure 6:
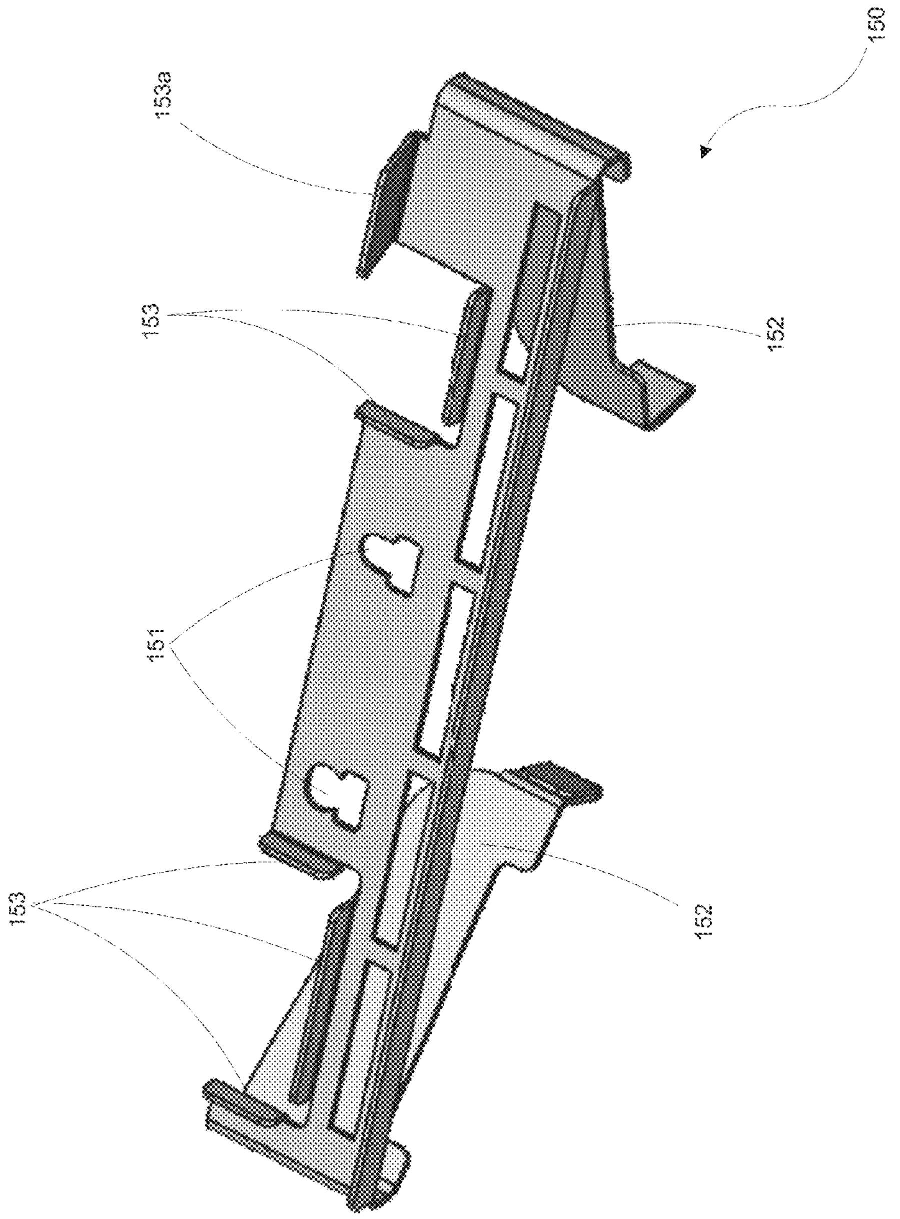

Referring now to FIGS. 1, 5, and 6, the storage card adapter 100 can further include a spring arm attachment 150 removably coupled to the front end side wall 111 of the carrier frame 110. The spring arm attachment 150 can be coupled to the carrier frame 110 via the pins 130 which, in addition to extending through the openings 115 in the front end side wall 111, also extend through arm openings 151 in the spring arm attachment 150. As with the openings 115, the size of the arm openings 151 can be such that the pins 130 form a friction fit with the pins 130 in order to secure the spring arm attachment 150 to the front end side wall 111. Also like the openings 115, the arm openings 151 can include a portion through which pins 130 extend and a portion that is not occupied by the pin 130 when inserted therethrough. This unoccupied portion of arm opening 151 provides a manner for removing the pins 130 from the spring arm attachment 150 and the front end side wall 111 in order to separate the spring arm attachment 150 from the front end side wall 111. The number of arm openings 151 in the spring arm attachment 150 will generally correspond to the number of openings 115 in the front end side wall 111. The openings 115 also generally align with the arm openings 151 when the spring arm attachment 150 is coupled to the front end side wall 111 so that a pin 130 can be inserted through each pair of openings 115, 151 to thereby secure the spring arm attachment 150 to the front end side wall 111.

With reference to FIGS. 5 and 6, the spring arm attachment 150 includes a spring arm 152 at both ends of the spring arm attachment 150. The spring arms 152 are oriented such that they project away from the storage card adapter 100 when the spring arm attachment 150 is coupled to the front end side wall 111 of the carrier frame 110. The spring arms 152 are deflectable biasing members configured to engage and press against a divider at the rear end portion of a drive bay such that the spring arms 152 are operative to maintain a force against the carrier frame 110. Accordingly, the spring arms 152 urge the carrier frame 110 toward a drive bay connector of a drive bay.

The spring arm attachment 150 can further include a plurality of inwardly projecting tabs 153. The tabs 153 are generally provided at locations on the spring arm attachment 150 that coincide with the edges of the openings 116 in the front end side wall 111 so that the tabs 153 extend into the openings 116 and help to prevent movement of the spring arm attachment 150 once coupled to the front end side wall 111. This configuration can be seen in, e.g., FIG. 1 where the tabs 153 located proximate the pins 130 extend into the large openings 116. The spring arm attachment 150 can also include a stop tab 153*a* that extends into an opening 116 in the front end side wall 111 and provides a stop that prevents the cover 120 from being lowered too far into the carrier frame 110.

With reference to FIGS. 7-10, another embodiment of a storage card adapter 200 is illustrated. The storage card adapter 200 includes a carrier frame 210, a cover 220, and a latch 230. The overall dimensions of the storage card adapter 200 are selected such that the storage card adapter 200 has an envelope compatible with a drive bay into which the storage card adapter 200 can be inserted. For example, in the depicted embodiment, the storage card adapter 200 has an envelope compatible with a drive bay configured to receive a 3.5 inch hard drive. Clamping posts and guide posts as discussed previously with respect to storage card adapter 100 can also be provided in the storage card adapter 200.

The carrier frame 210 includes at least a front end side wall 211 and a back end side wall 212 opposite the front end side wall 211. The front end side wall 211 includes an aperture 213 which in some embodiments is centrally located along the length of the front end side wall 211. The front end side wall 211 can also optionally include other apertures 213*a* which are provided primarily for ventilation purposes. As most clearly shown in FIG. 10, the front end side wall 211 can also include a ledge 215 located above the aperture 213. As discussed in greater detail below, the ledge 215 is provided so that the latch 230 can be locked into position on the front end side wall 211 of the carrier frame 210.

The cover 220 includes a front edge 221 and a back edge 222 opposite the front edge 221. The back edge 222 interacts with the back end side wall 212 in the same manner as described above with respect to storage card adapter 100 so that the cover 220 pivots about the top of the back end side wall 212 and can be secured to the carrier frame 210 at the back end side wall 212. Proximate the front edge 221 and centrally located along the length of the edge 221, a tab 223 is provided. The tab 223 extends in a perpendicular direction away from an interior surface of the cover 220. The tab includes an aperture 224. The dimensions of the cover 220 are such that when the cover 220 is mated with the carrier frame 210, the tab 223 resides inside the carrier frame 210, such as just inside of the front end side wall 211.

Figure 10:
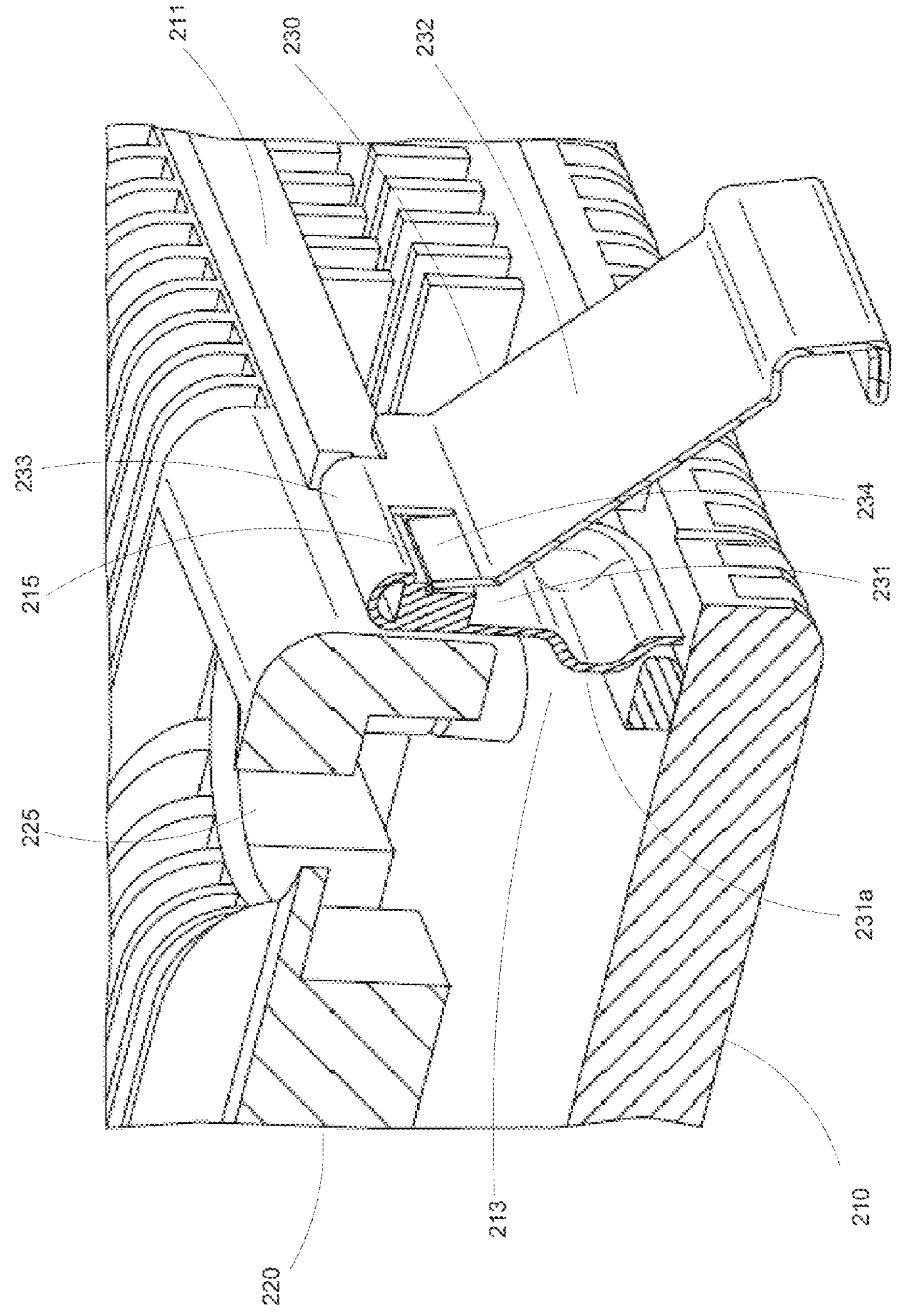
FIG. 10 is a cross-sectional isometric view of the storage card adapter shown in FIG. 7.

The latch 230 is configured to be coupled with the front end side wall 211 of the carrier frame 210. As best shown in FIG. 10, the latch 230 includes an interior segment 231 located inside the carrier frame 210 when the latch 230 is coupled to the carrier frame 210, an exterior segment 232 located outside the carrier frame 210 when the latch 230 is coupled to the carrier frame 210, and a coupling segment 233 that connects the interior segment 231 to the exterior segment 232 and straddles the front end side wall 211.

Figure 9:
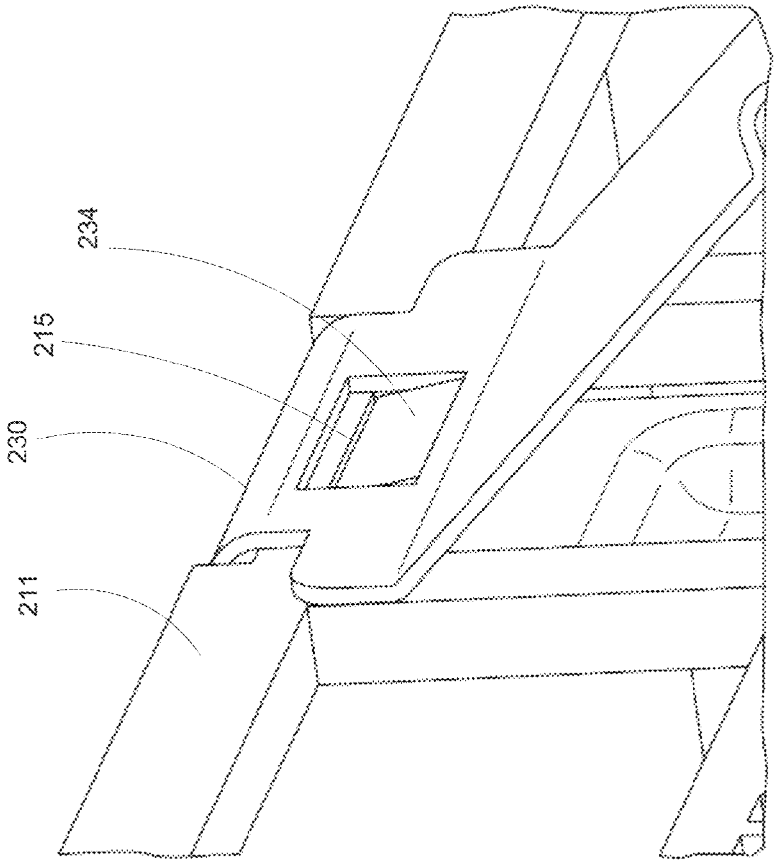
FIG. 9 is an isometric view of a portion of the latch of the storage card adapter shown in FIG. 7.

As best shown in FIGS. 9 and 10, the latch 230 is coupled to the front end side wall 211 via an angled portion 234 provided on the coupling segment 233 of the latch 230. The angled portion 234 protrudes inwardly towards the front end side wall 211 and engages with the ledge 215 to prevent the latch 230 from moving up and off the front end side wall 211 after the angled portion 234 engages the ledge 215. When the latch 230 is installed on the front end side wall 211, the angled portion 234 deflects backwards until it passes the ledge 215, at which point it snaps back into place, engages with the ledge 215 and thereby secures the latch 230 to the front end side wall 211.

As best shown in FIG. 10, the interior segment 231 includes a protrusion 231*a* at the distal end of the interior segment 231. The protrusion 231*a* is configured to be received in the aperture 224 of the tab 223 (FIG. 7) when the cover 220 is mated with the carrier frame 210 and the tab 223 slides inside the front end side wall 211. The interior segment 231 can deflect back towards the exterior of the carrier frame 210 so that when the distal end of the tab 223 first engages the protrusion 231*a*, the protrusion 231*a* deflects back until it can snap forward and into the aperture 224. In this manner, the cover 220 can be secured to the carrier frame 210. In some embodiments, the dimensions and location of the various components involved in the latching of the cover 220 to the carrier frame 210 are selected such that at least 75 lbs. of compressive force are applied to components housed within the storage card adapter 200 when the protrusion 231*a* is received in aperture 224.

The exterior segment 232 is generally angled away from the carrier frame 210. In some embodiments, the exterior segment 232 serves as a spring arm that is a deflectable biasing member configured to engage and press against a divider at the rear end portion of a drive bay such that the exterior segment is operative to maintain a force against the carrier frame 210. Accordingly, the exterior segment 232 urges the carrier frame 210 toward a drive bay connector of a drive bay.

Figure 7:
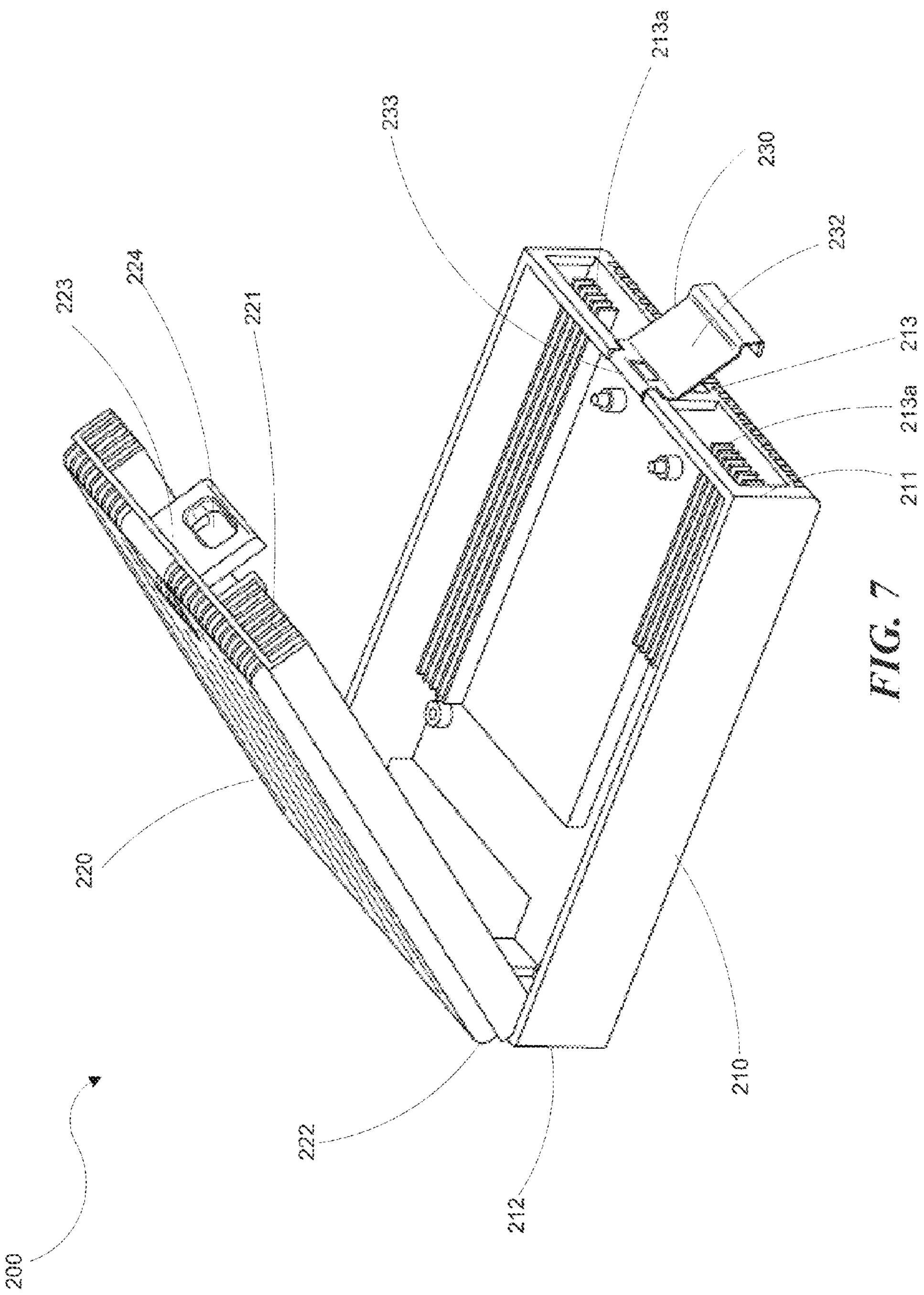
FIG. 7 is an isometric view of a storage card adapter according to another representative embodiment.
Figure 8:
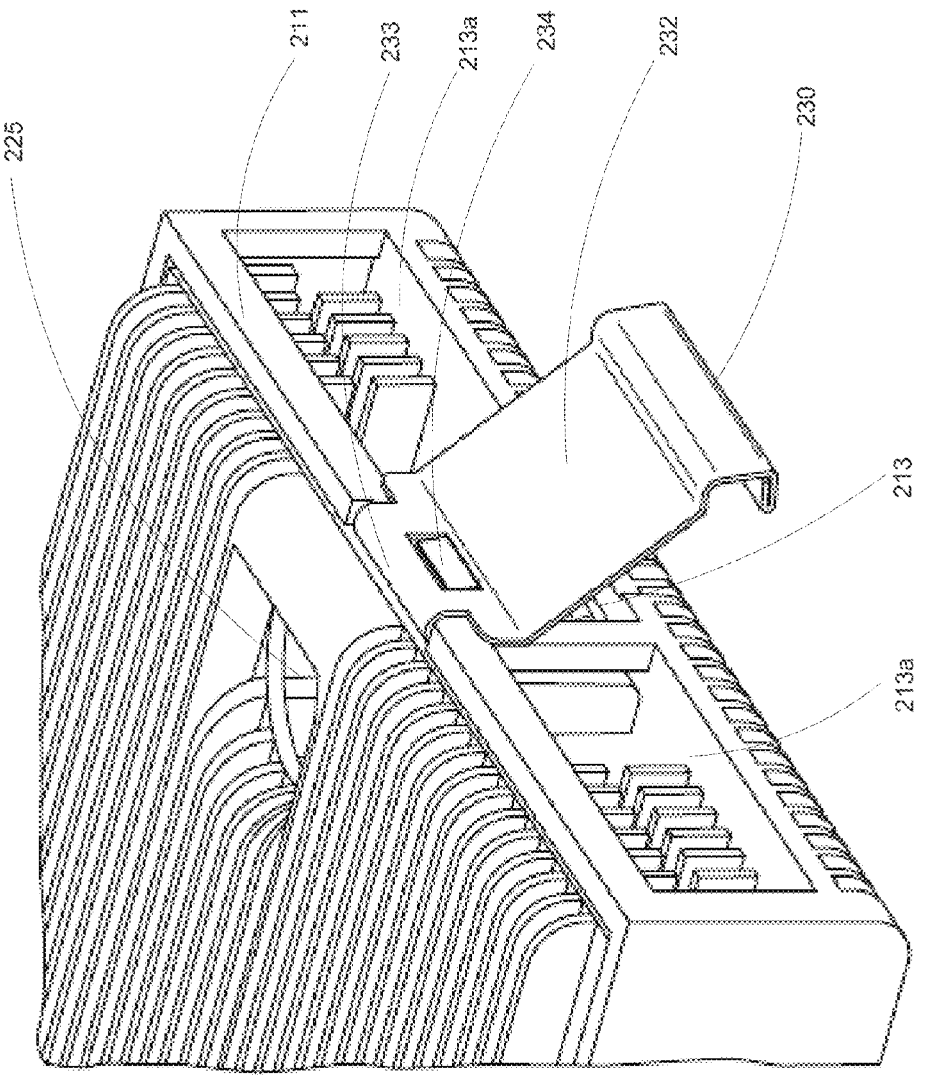
FIG. 8 is an isometric view of the latch of the storage card adapter shown in FIG. 7.

With specific reference to FIGS. 8 and 10, the cover 220 includes an opening 225 proximate the front edge 221 and aligned with the tab 223. The opening 225 provides access to the protrusion 231*a* when it is engaged with the aperture 224 in the tab 223 (FIG. 7). Specifically, the opening 225 allows, for example, a finger or tool to be inserted into the opening 225, at which point the protrusion 231*a* can be depressed towards the exterior of the carrier frame 210 to disengage the protrusion 231*a* from the aperture 224. At this point, the cover 220 can be lifted upwards to unmate the cover 220 from the carrier frame 210.

The above described adapters are suitable for use when housing storage cards requiring heat dissipation in a storage card adapter. The storage card adapters are especially well suited for use with housing and cooling M.2 storage cards. As described in detail above, the configuration of the storage card adapters herein provides for compressing thermal pads against storage cards housed in a storage card adapter to thereby enhance the efficiency of the thermal pads in transferring heat away from the storage cards and out of the storage card adapter. The latch systems ensure that a sufficient amount of compressive force is provided while providing an easy to use latch system that minimizes the amount of force needed to engage the latch system.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

We claim:

1. A storage card adapter usable with storage cards for insertion into a drive bay, the storage card adapter comprising:

a carrier frame having an envelope compatible with the drive bay and configured to receive a printed circuit board, the carrier frame comprising a front end side wall with at least one opening formed therein;

at least one pin comprising a shaft and a pin head at one end of the shaft, wherein the pin extends through the opening in the front end side wall such that the pin head is located on an exterior side of the front end side wall; and a cover compatible with an open top of the carrier frame, the cover comprising:

a front edge and a back edge opposite the front edge;

a pivot post extending from the front edge of the cover; and a latch clamp pivotable about the pivot post and comprising a curved slot having an open end and a closed end;

wherein the latch clamp is configured to receive the at least one pin head in the open end of the curved slot and, upon pivoting of the latch clamp about the pivot post, the pin head travels towards the closed end of the curved slot and thereby compresses together the carrier frame and the cover.

2. The storage card adapter of claim 1, wherein the latch clamp comprises a lever extending away from the pivot post and configured for use in pivoting the latch clamp about the pivot post.

3. The storage card adapter of claim 2, wherein the open end of the curved slot is aligned to receive the pin head therein when the lever is oriented in a position perpendicular to the cover and wherein the pin head travels the length of the curved slot to the closed end of the curved slot when the lever is pivoted 90 degrees from the perpendicular position.

4. The storage card adapter of claim 1, wherein the closed end of the curved slot includes a recess configured to receive the pin head and prevent movement of the pin head back towards the open end of the curved slot.

5. The storage card adapter of claim 1, wherein all components of the storage card adapter are dimensioned such that at least 75 lbs. of compressive force is applied to a storage card sandwiched between two thermal pads housed within the storage card adapter when the latch clamp is moved to a latched position.

6. The storage card adapter of claim 1, wherein the pins are removable from the openings and are secured within the openings via a friction fit between the shaft of the pin and the opening.

7. The storage card adapter of claim 1, wherein the front end side wall comprises two openings and a pin extending through each of the two openings and the latch clamp engages with one of the two pins.

8. The storage card adapter of claim 7, further comprising:

a spring arm attachment detachably coupled to the front end side wall of the carrier frame, the spring arm attachment comprising:

a spring arm at each side end of the spring arm attachment and configured to secure the storage card adapter in the drive bay; and two openings through which the pins extend to thereby secure the spring arm attachment to the carrier frame.

9. The storage card adapter of claim 8, wherein the front end side wall of the carrier frame includes at least one ventilation opening and the spring arm attachment further comprises a tab extending into the carrier frame through the ventilation opening, the tab configured to be a stop for the cover.

10. The storage card adapter of claim 3, wherein the front edge of the cover includes an opening proximate the location of the lever of the latch clamp when the latch clamp is in a latched position.

11. The storage card adapter of claim 8, wherein the openings in the front end side wall and the spring arm attachment both include a portion not occupied by the shaft of the pin when the pin is inserted in the openings.

12. The storage card adapter of claim 1, wherein:

the cover includes a plurality of clamping posts extending from an interior surface of the cover; and the carrier frame includes a plurality of guide posts extending from an interior surface of the carrier frame, the number of guide posts corresponding to the number of clamping posts;

wherein each guide post is configured to receive a corresponding clamping post when the cover is mated with the carrier frame; and wherein the guide posts and clamping posts are positioned such that a terminal end of a storage card housed within the storage card adapter is clamped between the guide post and the clamping post.

13. A storage card adapter usable with storage cards for insertion into a drive bay, the storage card adapter comprising:

a carrier frame having an envelope compatible with the drive bay and configured to receive a printed circuit board, the carrier frame comprising:

a front end side wall and a back end side wall opposite the front side wall, the front end side wall having an aperture formed therein;

a cover compatible with an open top of the carrier frame, the cover comprising:

a front edge and a back edge opposite the front edge; and a tab located at the front edge of the cover, the tab extending in a perpendicular direction from an interior surface of the cover and having an aperture formed therein; and a latch removably coupled to the front end side wall of the carrier frame, the latch comprising:

an interior segment having a protrusion located proximate a distal end of the interior segment;

an exterior segment angled away from the front end side wall; and a coupling segment between the interior segment and the exterior segment, the coupling segment configured to couple with a portion of the front end side wall above the aperture;

wherein the aperture in the tab receives the protrusion in the interior segment when the cover is mated with the carrier frame to thereby secure the cover the carrier frame.

14. The storage card adapter of claim 13, wherein the portion of the front end side wall above the aperture in the front end side wall includes a ledge and the coupling segment of the latch includes an angled tab configured to engage with the ledge to thereby prevent the latch from decoupling with the carrier frame.

15. The storage card adapter of claim 13, wherein the exterior segment is configured to secure the carrier frame in the drive bay when the carrier frame is inserted in the drive bay.

16. The storage card adapter of claim 13, wherein the cover includes an opening proximate the cover tab such that the interior segment protrusion engaged with the tab aperture can be accessed when the cover is mated with the carrier frame.

17. The storage card adapter of claim 16, wherein the interior segment is depressable in a direction towards an exterior of the storage card adapter such that the protrusion can be disengaged from the tab aperture.

18. The storage card adapter of claim 13, wherein all components of the storage card adapter are dimensioned such that compressive force is applied to a storage card sandwiched between two thermal pads housed within the storage card adapter when the interior segment protrusion is engaged with the tab aperture.

19. The storage card adapter of claim 13, wherein:

the cover includes a plurality of clamping posts extending from an interior surface of the cover; and the carrier frame includes a plurality of guide posts extending from an interior surface of the carrier frame, the number of guide posts corresponding to the number of clamping posts;

wherein each guide post is configured to receive a corresponding clamping post when the cover is mated with the carrier frame; and wherein the guide posts and clamping posts are positioned such that a terminal end of a storage card housed within the storage card adapter is clamped between the guide post and the clamping post.

* * * * *

UNITED STATES PATENT AND TRADEMARK OFFICE
CERTIFICATE OF CORRECTION

PATENT NO. : 10,054,992 B1
APPLICATION NO. : 15/683724
DATED : August 21, 2018
INVENTOR(S) : Ehlen et al.

It is certified that error appears in the above-identified patent and that said Letters Patent is hereby corrected as shown below:

In the Claims

In Column 10, Line 24, in Claim 13, delete “the cover the” and insert -- the cover to the --, therefor.

Signed and Sealed this
Thirteenth Day of November, 2018

Andrei Iancu
*Director of the United States Patent and Trademark Office*